(12) United States Patent
Chung et al.

(10) Patent No.: US 7,902,026 B2
(45) Date of Patent: Mar. 8, 2011

(54) METHOD OF FABRICATING SEMICONDUCTOR DEVICE HAVING VERTICAL CHANNEL TRANSISTOR

(75) Inventors: Hyun-Woo Chung, Seoul (KR); Jae-Man Yoon, Hwaseong-si (KR); Yong-Chul Oh, Suwon-si (KR); Hui-Jung Kim, Seoul (KR); Hyun-Gi Kim, Hwaseong-si (KR); Kang-Uk Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 125 days.

(21) Appl. No.: 12/314,139

(22) Filed: Dec. 4, 2008

(65) Prior Publication Data

US 2009/0148991 A1    Jun. 11, 2009

(30) Foreign Application Priority Data

Dec. 7, 2007   (KR) .................. 10-2007-0126874

(51) Int. Cl.
  *H01L 21/336*   (2006.01)
(52) U.S. Cl. ................. 438/270; 257/E21.629
(58) Field of Classification Search .......... 438/206, 438/209; 257/E21.629
  See application file for complete search history.

(56) References Cited

U.S. PATENT DOCUMENTS

| | | | |
|---|---|---|---|
| 5,464,780 A * | 11/1995 | Yamazaki | 438/270 |
| 6,218,236 B1 | 4/2001 | Economikos et al. | |
| 2006/0097304 A1 * | 5/2006 | Yoon et al. | 257/307 |
| 2007/0082448 A1 * | 4/2007 | Kim et al. | 438/268 |
| 2007/0181925 A1 | 8/2007 | Yoon et al. | |
| 2007/0190766 A1 | 8/2007 | Seo et al. | |
| 2008/0173936 A1 | 7/2008 | Yoo et al. | |

FOREIGN PATENT DOCUMENTS

| | | |
|---|---|---|
| KR | 10-2007-0047069 A | 5/2007 |
| KR | 10-0723527 B1 | 5/2007 |
| KR | 10-0734313 B1 | 6/2007 |
| KR | 10-2008-0068544 A | 7/2008 |

* cited by examiner

*Primary Examiner* — Chandra Chaudhari
(74) *Attorney, Agent, or Firm* — Lee & Morse, P.C.

(57) ABSTRACT

A method of fabricating a semiconductor device having a vertical channel transistor, the method including forming a hard mask pattern on a substrate, forming a preliminary active pillar by etching the substrate using the hard mask pattern as an etch mask, reducing a width of the preliminary active pillar to form an active pillar having a width less than that of the hard mask pattern, forming a lower source/drain region by implanting impurity ions into the substrate adjacent to the active pillar using the hard mask pattern as an ion implantation mask, and forming an upper source/drain region on the active pillar and vertically separated from the lower source/drain region.

19 Claims, 8 Drawing Sheets

METHOD OF FABRICATING SEMICONDUCTOR DEVICE HAVING VERTICAL CHANNEL TRANSISTOR

BACKGROUND

1. Technical Field

Embodiments relate to a method of fabricating a semiconductor device that includes a vertical channel transistor.

2. Description of the Related Art

As a semiconductor device becomes highly integrated, research into integrating a number of devices within a limited space is actively progressing. A conventional planar transistor includes a gate electrode disposed on a semiconductor substrate, and source and drain regions disposed in the semiconductor substrate laterally adjacent to both sides of the gate electrode. In such a structure, shrinking the gate electrode yields a reduced distance between the source and drain regions, such that an effective channel length is shortened. The decrease in the effective channel length may result in a short channel effect and active switching characteristics of the device may be deteriorated. Also, the reduced gate electrode, and source and drain regions, may result in deteriorated current drivability. Thus, developments in more highly integrated structures such as vertical channel transistors are needed.

SUMMARY

Embodiments are therefore directed to a method of fabricating a semiconductor device that includes a vertical channel transistor, which substantially overcome one or more of the problems due to the limitations and disadvantages of the related art.

It is therefore a feature of an embodiment to provide a method of fabricating a semiconductor device that includes a vertical channel transistor, the method minimizing the use of photolithographic patterning operations.

It is therefore another feature of an embodiment to provide a method of fabricating a semiconductor device that includes a vertical channel transistor, the method minimizing the introduction of impurity ions into an active material portion of the transistor.

At least one of the above and other features and advantages may be realized by providing a method of fabricating a semiconductor device having a vertical channel transistor, the method including forming a hard mask pattern on a substrate, forming a preliminary active pillar by etching the substrate using the hard mask pattern as an etch mask, reducing a width of the preliminary active pillar to form an active pillar having a width less than that of the hard mask pattern, forming a lower source/drain region by implanting impurity ions into the substrate adjacent to the active pillar using the hard mask pattern as an ion implantation mask, and forming an upper source/drain region on the active pillar and vertically separated from the lower source/drain region.

Reducing the width of the preliminary active pillar may include etching the preliminary active pillar using an isotropic etching process having a higher etching rate with respect to the preliminary active pillar than with respect to the hard mask pattern. An outer periphery of the active pillar may be separated from an imaginary extension line that extends from a sidewall of the hard mask pattern normal to the substrate.

The lower source/drain region may be formed to include a high-concentration impurity region and a low-concentration impurity region, the low-concentration impurity region surrounding sidewalls and a bottom of the high-concentration impurity region. Forming the lower source/drain region may include alternately implanting first impurity ions and second impurity ions, the second impurity ions having a conductivity type different from that of the first impurity ions. The first and second impurity ions may be selected from arsenic ions and phosphorus ions.

The method may further include forming a sidewall oxide layer on a sidewall of the active pillar before implanting the impurity ions. An outer periphery of the sidewall oxide layer may be separated from an imaginary extension line that extends from a sidewall of the hard mask pattern normal to the substrate. The method may further include forming a replacement gate on the sidewall of the active pillar. The sidewall oxide layer may remain between the active pillar and the replacement gate.

The method may further include, after forming the lower source/drain region, forming a bit mask pattern covering the active pillar, etching the substrate using the bit mask pattern as an etch mask to form a bit groove that defines a buried bit line, wherein the bit groove passes through the lower source/drain region, and forming an isolation layer filling the bit groove. An upper surface of the isolation layer may be formed to be higher than the lower source/drain region.

The method may further include, before forming the isolation layer, forming a leakage prevention region by implanting impurity ions having a different conductivity type from the lower source/drain region into a portion of the substrate that is exposed at a bottom of the bit groove.

The method may further include, before forming the bit mask pattern, forming a replacement gate on a sidewall of the active pillar, The replacement gate may be formed of a material layer having an etch selectivity with respect to the bit mask pattern. The method may further include, after forming the isolation layer, removing the replacement gate, forming a gate electrode surrounding the sidewall of the active pillar and crossing the buried bit line, wherein an upper surface of the gate electrode is below an upper surface of the active pillar, removing the hard mask pattern and exposing the active pillar, and forming an upper source/drain region by implanting impurity ions into the exposed active pillar using impurity ions having the same conductivity type as impurity ions in the lower source/drain region.

The method may further include forming a storage node on the upper source/drain region, wherein the storage node is electrically connected to the upper source/drain region.

At least one of the above and other features and advantages may also be realized by providing a method of fabricating a semiconductor device having a vertical channel transistor, the method including forming a hard mask pattern on a substrate, forming a preliminary active pattern by etching the substrate using the hard mask pattern as an etch mask, reducing a width of the preliminary active pattern to form an active pattern having a width less than that of the hard mask pattern, implanting impurity ions into the substrate adjacent to the active pattern using the hard mask pattern as an ion implantation mask, and forming an upper source/drain region on the active pattern and vertically separated from the impurity ions that are in the substrate adjacent to the active pattern.

Reducing the width of the preliminary active pattern may include etching the preliminary active pattern using an isotropic etching process having a higher etching rate with respect to the preliminary active pattern than with respect to the hard mask pattern. An outer periphery of the active pattern may be separated from an imaginary extension line that extends from a sidewall of the hard mask pattern normal to the substrate.

Implanting the impurity ions into the substrate may include alternately implanting first impurity ions and second impurity ions, the second impurity ions having a conductivity type different from that of the first impurity ions. The first and second impurity ions may be selected from arsenic ions and phosphorus ions. The method may further include, before implanting the impurity ions, forming a sidewall oxide layer on the sidewall of the active pattern, wherein the sidewall oxide layer is separated from an imaginary extension line that extends from a sidewall of the hard mask pattern normal to the substrate.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
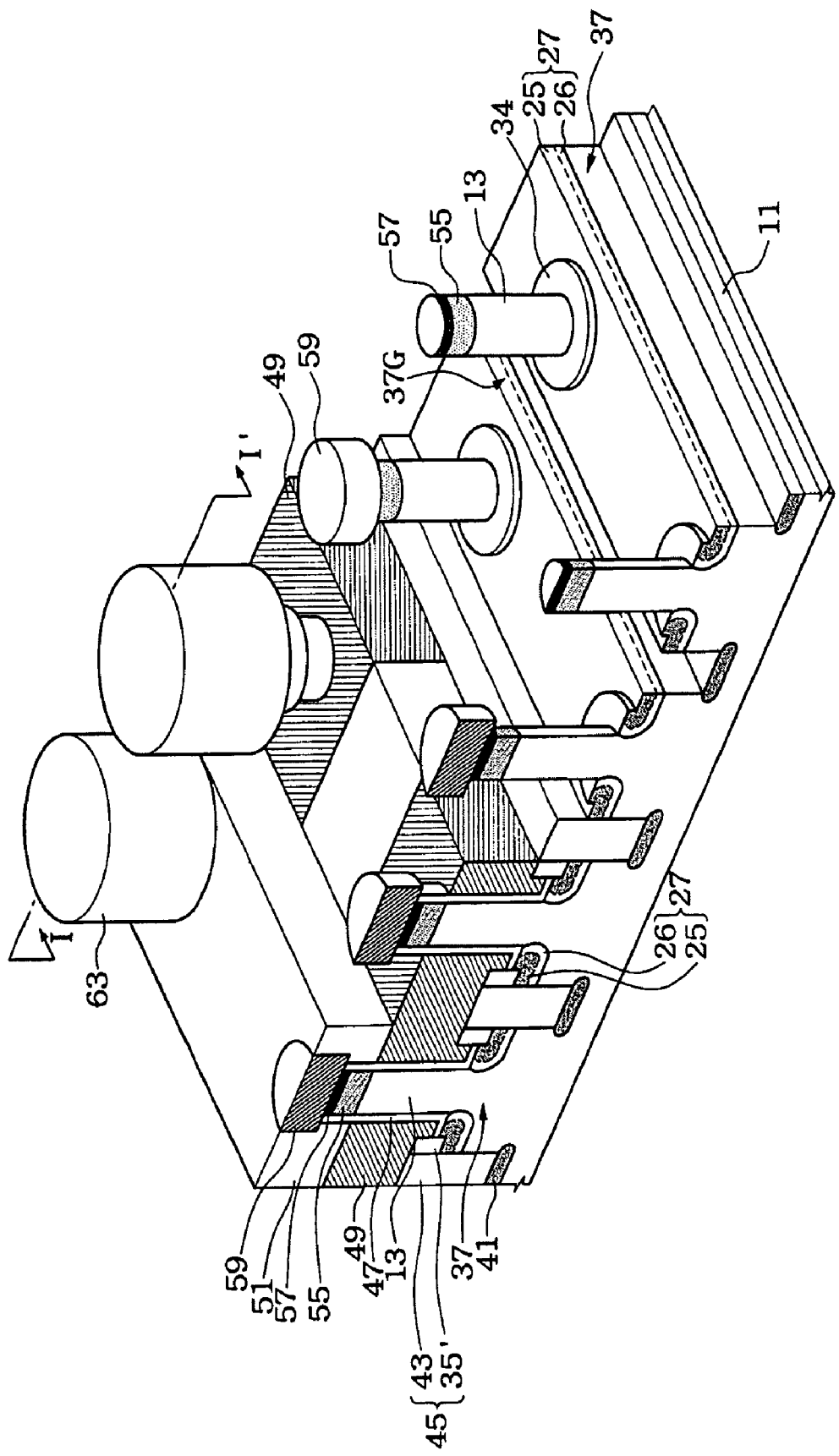
FIG. 1 illustrates a perspective cut-away view of a semiconductor device fabricated according to example embodiments.

Korean Patent Application No. 10-2007-0126874, filed on Dec. 7, 2007, in the Korean Intellectual Property Office, and entitled: "Method of Fabricating Semiconductor Device Having Vertical Channel Transistor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a perspective cut-away view of a semiconductor device fabricated according to example embodiments. The semiconductor device may be, e.g., a Dynamic Random Access Memory (DRAM) having vertical channel transistors, in which source and drain regions are separated vertically, and current flow through the channel region is in a direction substantially normal to the substrate.

FIGS. 2 to 13 illustrate cross-sectional views, taken along line I-I' of FIG. 1, of stages in a method of fabricating a semiconductor device according to a first embodiment.

A method of fabricating a semiconductor device according to a first example embodiment will now be described with reference to FIGS. 1 to 13.

Figure 2:
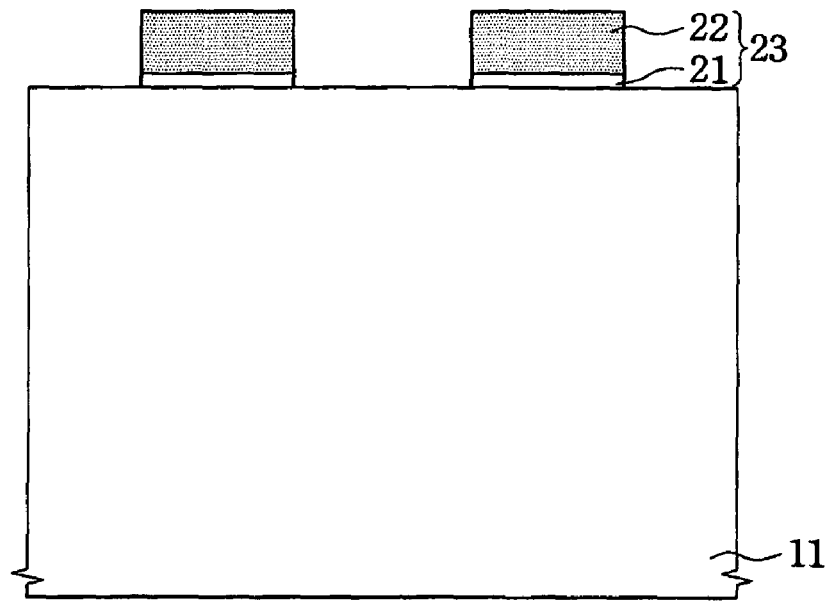
FIGS. 2 to 13 illustrate cross-sectional views, taken along line I-I' of FIG. 1, of stages in a method of fabricating a semiconductor device according to a first embodiment.

Referring to FIGS. 1 and 2, a hard mask pattern 23 may be formed on a substrate 11. The substrate 11 may be a semiconductor substrate including a silicon (Si) wafer, a germanium (Ge) wafer, a silicon-germanium (SiGe) wafer and/or a silicon-on-insulator (SOI) wafer. For convenience, the first embodiment is described as using a silicon wafer as the substrate 11. Impurity ions of a first conductivity type may be implanted into a surface of the substrate 11 to a predetermined depth. The first conductivity type may be an N type or a P type. The N type impurity ions may include, e.g., one or more of phosphorus (P) and arsenic (As), and the P type impurity ions may include, e.g., boron (B). For convenience, the first embodiment is described as using P type impurity ions as the first conductivity type.

The hard mask pattern 23 may be formed by sequentially stacking a buffer oxide layer 21 and a mask layer 22, such that the buffer oxide layer 21 is between the mask layer 22 and the substrate 11. The buffer oxide layer 21 may be formed of, e.g., a thermal oxide layer. When the buffer oxide layer 21 is used, it may function to buffer stress between the substrate 11 and the mask layer 22. The mask layer 22 may be formed of a material layer having an etch selectivity with respect to the substrate 11. For example, the mask layer 22 may be formed of a nitride layer such as a silicon nitride layer and/or a silicon oxynitride layer.

The hard mask pattern 23 may be shaped as, e.g., an island shape type, a line & space shape, and/or a combination thereof. For convenience, the first embodiment is described as using a disk-shaped island for the hard mask pattern 23, the islands being arranged in a regular array in row and column directions.

Figure 3:
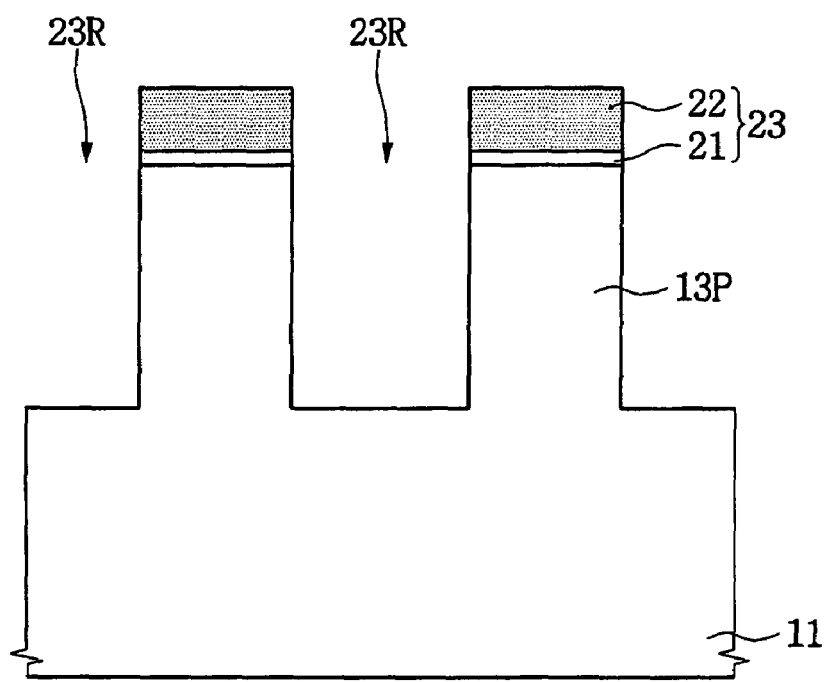

Referring to FIGS. 1 and 3, the substrate 11 may be etched using the hard mask pattern 23 as an etch mask to form a preliminary active pillar 13P. The substrate 11 may be etched using an anisotropic etching process. Accordingly, an exposed part of the substrate 11 may be downwardly recessed to form a first recessed region 23R. The preliminary active pillar 13P may be formed in the shape of a pillar projecting normal from the substrate 11. A plurality of preliminary active pillars 13P that are aligned in row and column directions may be formed at the same time.

The preliminary active pillar 13P may be self-aligned at a lower part of the hard mask pattern 23. Thus, an exposed sidewall of the preliminary active pillar 13P may be aligned with a hypothetical extension line extending normal to the substrate from an outer periphery of the hard mask pattern 23. Accordingly, an outer perimeter of the preliminary active pillar 13P may be the same as an outer perimeter of the hard mask pattern 23.

Figure 4:
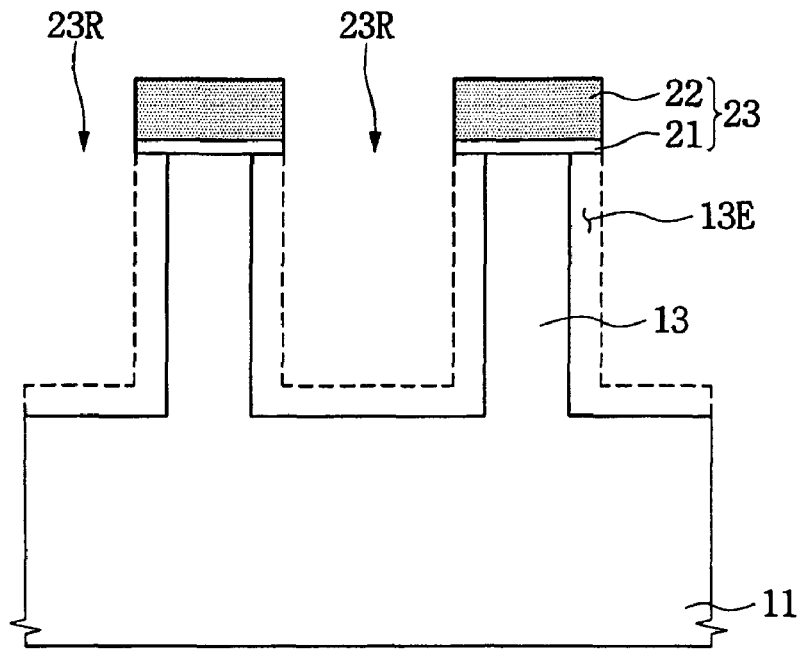

Referring to FIGS. 1 and 4, the preliminary active pillar 13P may be shrunk, i.e., lateral portions of the preliminary active pillar 13P may be removed, e.g., etched, to form an active pillar 13. By removing lateral portions of the preliminary active pillar 13P, the exposed surfaces of the preliminary active pillar 13P and the substrate 11 may be etched-back from an etching region 13E. Thus, the active pillar 13 may be formed to a narrower width than the hard mask pattern 23. The difference in widths of the hard mask pattern 23 and the active pillar 13 may result in a shadow region 23S underlying the hard mask pattern 23 and encompassing the active pillar 13. The outer periphery of the shadow region 23S is defined by a hypothetical, i.e., imaginary, extension line 23L that extends from an outer periphery of the hard mask pattern 23 to the substrate 11, the extension line 23L being normal to the substrate 11. A space defined by the extension line 23L and circumscribing the hard mask pattern 23 is the shadow region 23S. Thus, the active pillar 13 may be disposed in the shadow region 23S and an outer sidewall of the active pillar 13 may be separated from the extension line 23L. A distance between the sidewall of the active pillar 13 and the extension line 23L may be determined by the size of the etching region 13E.

The preliminary active pillar 13P may be shrunk using, e.g., an isotropic etching process having an etch selectivity between the hard mask pattern 23 and the substrate 11. The isotropic etching process may exhibit a higher etch rate with respect to the preliminary active pillar 13P and the substrate 11 than with respect to the hard mask pattern 23.

Figure 5:
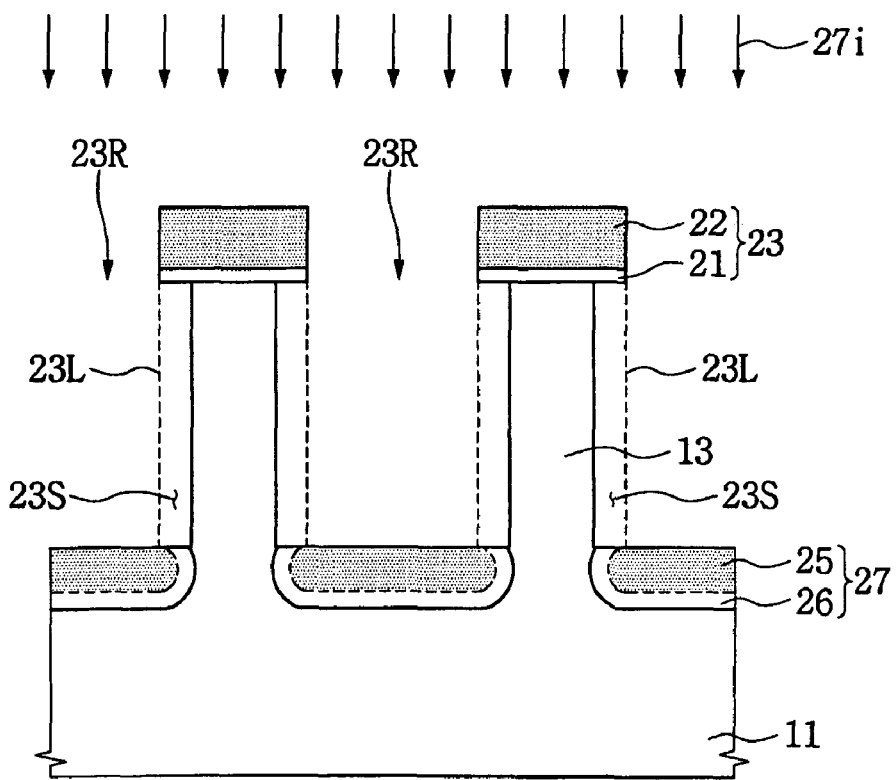

Referring to FIGS. 1 and 5, impurity ions of a second conductivity type different from the first conductivity type may be implanted into the substrate 11 to form a lower source/drain region 27. The lower source/drain region 27 may include a high-concentration impurity region 25 and a low-concentration impurity region 26. The low-concentration impurity region 26 may be formed to surround a bottom and sidewalls of the high-concentration impurity region 25, i.e., the low-concentration impurity region 26 may be wider than the high-concentration impurity region 25 and may also be under the high-concentration impurity region 25. When the first conductivity type is the P type, the second conductivity type may be the N type. Also, when the first conductivity type is the N type, the second conductivity type may be the P type. In the first example embodiment, the second conductivity type may be the N type. For convenience, the first embodiment is described as using N type impurities as the second conductivity type.

The lower source/drain region 27 may be formed by performing a first ion implantation process 27i using the hard mask pattern 23 as an ion implantation mask. The implantation of the second conductivity type impurity ions may be performed in a vertical direction with respect to the surface of the substrate 11.

While the first ion implantation process 27i is performed, the second conductivity type impurity ions may proceed in a straight line unless they collide with obstacles. The active pillar 13 may exist in a region along the etching region 13E in the shadow region 23S. Thus, a structure may be provided in which there is nothing to impede the progress of the second conductivity type impurity ions while the first ion implantation process 27i is performed. Accordingly, the second conductivity type impurity ions may be prevented from collisions, and thus be prevented from dispersing and infiltrating the active pillar 13.

The second conductivity type impurity ions passing by the hard mask pattern 23 may be implanted into the substrate 11 at an outer periphery of the shadow region 23S. Thus, the lower source/drain region 27 may be self-aligned with the outer periphery of the shadow region 23S.

The lower source/drain region 27 may be formed using, e.g., a double diffused drain (DDD) technique. The DDD technique may include alternately implanting conductivity type impurity ions different from each other into the substrate 11 while the first ion implantation process 27i is performed. For example, while the first ion implantation process 27i is performed, As ions and P ions may be respectively implanted into the substrate 11 one time. The As ions may exhibit a different diffusion rate from the P ions. In this case, both the As ions and the P ions may exist in the high-concentration impurity region 25, and only one of the As ions and the P ions may exist in the low-concentration impurity region 26.

In another implementation, the high-concentration impurity region 25 and the low-concentration impurity region 26 may be formed by alternately implanting the same kind of the second conductivity type impurity ions into the substrate 11 using different ion implantation energies while the first ion implantation process 27i is performed.

Figure 6:
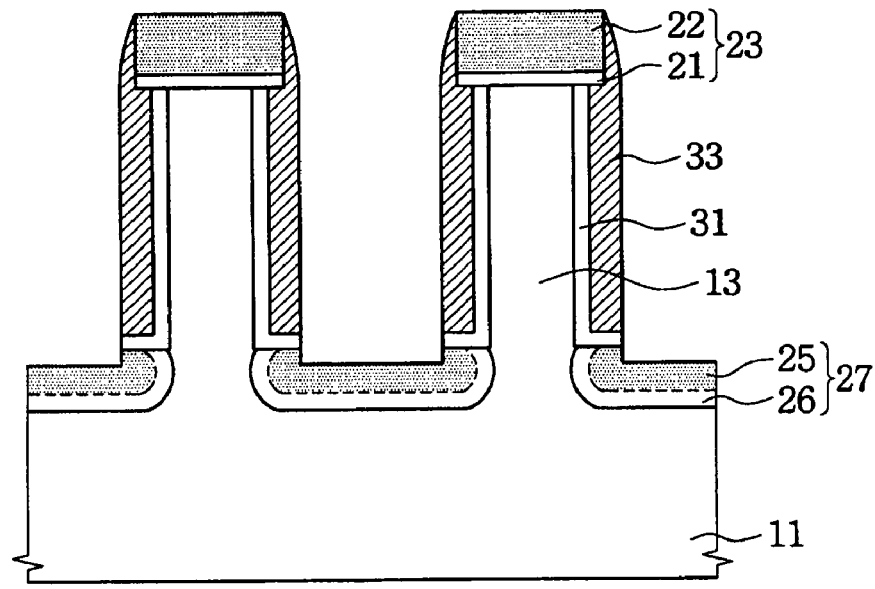

Referring to FIGS. 1 and 6, a sidewall oxide layer 31 may be formed on the sidewalls of the active pillar 13. The sidewall oxide layer 31 may be formed of, e.g., a thermal oxide layer or a chemical vapor deposition (CVD) silicon oxide layer.

A replacement gate 33 may be formed on the sidewall of the active pillar 13 having the sidewall oxide layer 31. The replacement gate 33 may be formed of, e.g., a silicon nitride layer, a polysilicon layer, a silicon oxynitride layer, a silicon oxide layer, or a combination thereof. Also, in the first example embodiment, the replacement gate 33 may be formed of a silicon nitride layer. For convenience, the first embodiment is described as using a silicon nitride layer for the replacement gate 33.

Referring to FIG. 6, forming the replacement gate 33 may include forming a replacement gate layer along a surface of the substrate 11 having the sidewall oxide layer 31, and then anisotropically etching the replacement gate layer. The replacement gate layer may be anisotropically etched using an overetch technique. In this case, the substrate 11 and the sidewall oxide layer 31, e.g., a lower lateral portion thereof, may be partially etched. A support plate 34 may be formed under the active pillar 13 (see FIG. 7).

The replacement gate 33 may cover the sidewalls of the active pillar 13. Additionally, the sidewall oxide layer 31 may remain between the replacement gate 33 and the active pillar 13. The replacement gate 33 may project from the shadow region 23S, i.e., it may be wider than the hard mask pattern 23. The support plate 34 may be self-aligned with the replacement gate 33 and the active pillar 13, and may have a width corresponding thereto. Thus, the support plate 34 may be wider than the shadow region 23S. Also, the support plate 34 may project above the surface of the substrate 11.

Figure 7:
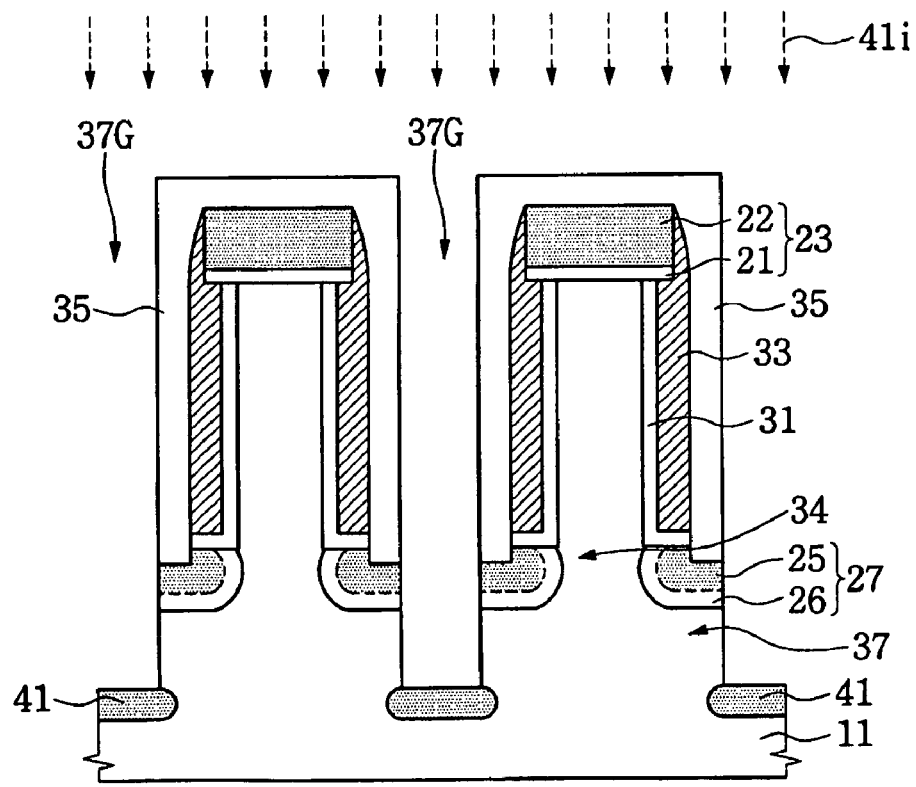

Referring to FIGS. 1 and 7, a bit mask pattern 35 may be formed on the substrate 11 having the replacement gate 33. The bit mask pattern 35 may be formed in the shape of a line. The bit mask pattern 35 may cover the replacement gate 33 and the active pillar 13, and may partially expose the substrate 11.

The bit mask pattern 35 may be formed of a silicon nitride layer, a silicon oxynitride layer, a silicon oxide layer or a combination thereof. The bit mask pattern 35 may be formed of a material having an etch selectivity with respect to the replacement gate 33. In an implementation, the bit mask pattern 35 may be formed of a material having an etch selectivity with respect to the replacement gate 33 as well as the hard mask pattern 23. For example, when the hard mask pattern 23 is formed of a nitride layer, and the replacement gate 33 is formed of a silicon nitride layer, the bit mask pattern 35 may be formed of a silicon oxynitride layer.

The substrate 11 may be etched using the bit mask pattern 35 as an etch mask to form a bit groove 37G for defining a buried bit line 37. The bit groove 37G may be formed to extend to a level below that of the lower extent of the lower source/drain region 27. The substrate 11 may be exposed at the bottom of the bit groove 37G. One or more buried bit lines 37 and one or more bit grooves 37G may be formed parallel to each other on the substrate 11. Accordingly, the replacement gate 33, the active pillar 13, and the support plate 34 may remain on the buried bit line 37. Moreover, the bit mask pattern 35 may cover the replacement gate 33, the active pillar 13, and the support plate 34.

The first conductivity type impurity ions may be implanted into the portion of the substrate 11 exposed at the bottom of the bit groove 37G to form a leakage prevention region 41. The leakage prevention region 41 may be formed by performing a second ion implantation process 41I, in which the bit mask pattern 35 is used as an ion implantation mask. In the first example embodiment, the first conductivity type impurity ions may include boron. The leakage prevention region 41 may function to reduce leakage current of the buried bit line 37.

Figure 8:
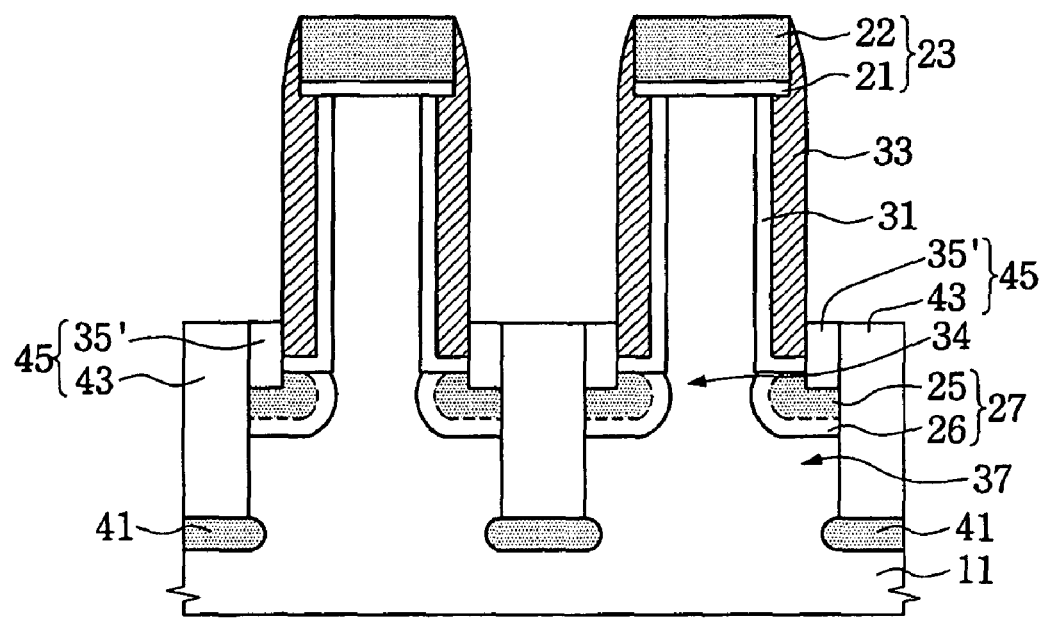

Referring to FIGS. 1 and 8, a first insulating pattern 43 filling the bit groove 37G may be formed. The first insulating pattern 43 may be formed by forming a first insulating layer that fills the bit groove 37G and covers the substrate 11, and then etching back the first insulating layer. An uppermost surface of the first insulating pattern 43 may be higher than the buried bit line 37. For example, the upper surface of the first insulating pattern 43 may be disposed at a higher level than the bottom of the replacement gate 33. The first insulating pattern 43 may be formed of, e.g., a silicon nitride layer, a silicon oxynitride layer, a silicon oxide layer, or a combination thereof.

In the first example embodiment, the first insulating pattern 43 may be formed of an insulating layer having substantially the same etch rate as the bit mask pattern 35. For example, both the first insulating pattern 43 and the bit mask pattern 35 may be formed of a silicon oxide layer. In this case, while the first insulating pattern 43 is formed, the bit mask pattern 35 may be etched-back at the same rate to remain between the first insulating pattern 43 and the buried bit line 37. The bit mask pattern 35 remaining between the first insulating pattern 43 and the buried bit line 37 may function as a second insulating pattern 35'. The first insulating pattern 43 and the second insulating pattern 35' may function together as an isolation layer 45.

Figure 9:
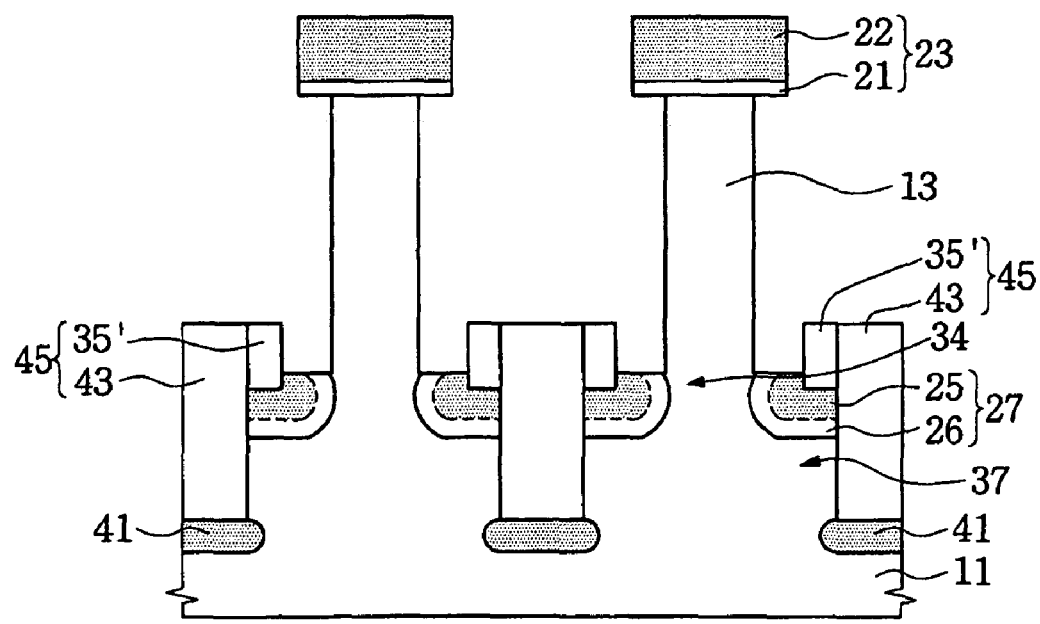

Referring to FIGS. 1 and 9, the replacement gate 33 and the sidewall oxide layer 31 may be removed to expose sidewalls of the active pillar 13. The hard mask pattern 23 may remain on the top of active pillar 13. The support plate 34 may be exposed between the active pillar 13 and the isolation layer 45. An upper surface of the isolation layer 45 may be disposed at a higher level than the support plate 34.

Figure 10:
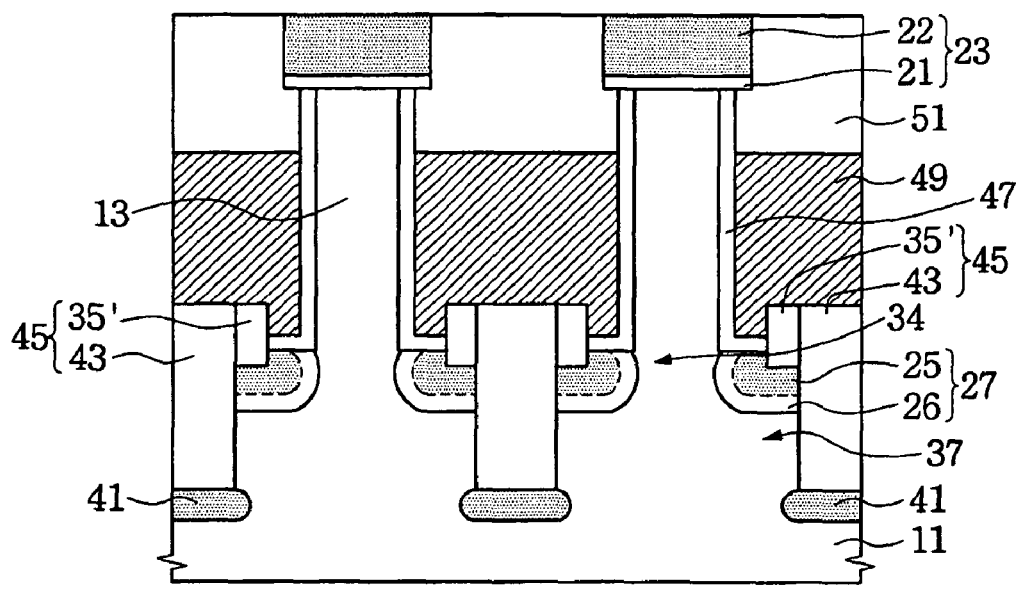

Referring to FIGS. 1 and 10, a gate dielectric layer 47 may be formed on sidewalls of the active pillar 13. The gate dielectric layer 47 may be formed of, e.g., a silicon oxide layer, a silicon nitride layer, a silicon oxynitride layer, a high-k dielectric layer, or a combination thereof. For example, the gate dielectric layer 47 may be formed of a thermal oxide layer.

A gate electrode 49 covering sidewalls of the active pillar 13 and crossing the buried bit line 37 may be formed. The gate electrode 49 may be formed to cover the sidewalls of the active pillar 13. Thus, the gate electrode 49 may be formed wider than the active pillar 13. The gate dielectric layer 47 may remain between the gate electrode 49 and the active pillar 13. The gate electrode 49 may be formed at a lower level than an upper surface of the active pillar 13.

The gate electrode 49 may extend to function as a word line 49. A plurality of word lines 49 may be formed to cross the buried bit line 37. In this case, the word lines 49 may be formed parallel to each other. The gate electrode 49 may be formed of a conductive layer, e.g., a polysilicon layer, a metal layer, a metal nitride layer, a metal silicide layer, or a combination thereof.

An interlayer insulating layer 51 may be formed on the substrate 11 having the gate electrode 49. The interlayer insulating layer 51 may be planarized until the hard mask pattern 23 is exposed. The interlayer insulating layer 51 may be planarized using, e.g., a chemical mechanical polishing (CMP) technique or an etch-back technique.

The interlayer insulating layer 51 may be formed of, e.g., a silicon oxide layer, a silicon nitride layer, a silicon oxynitride layer, a low-k dielectric layer, or a combination thereof. The interlayer insulating layer 51 may be formed of an insulating layer having an etch selectivity with respect to the hard mask pattern 23. For example, when the hard mask pattern 23 is formed of a nitride layer, the interlayer insulating layer 51 may be formed of a silicon oxide layer.

Figure 11:
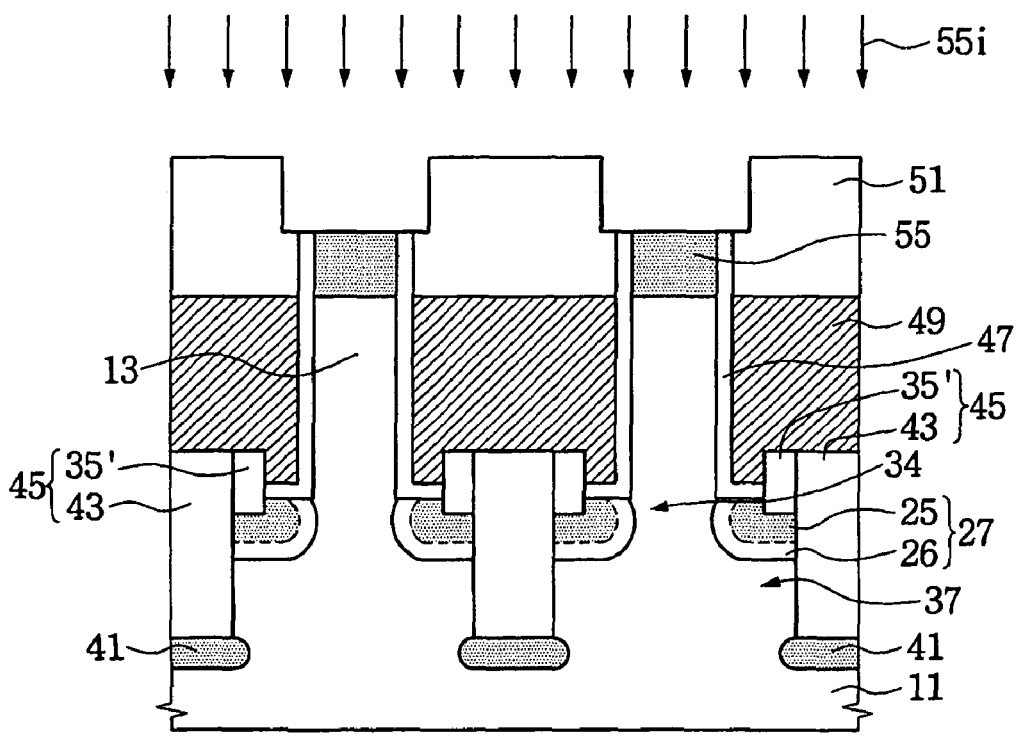

Referring to FIGS. 1 and 11, the hard mask pattern 23 may be removed to expose the active pillar 13. The second conductivity type impurity ions may be implanted into the exposed part of the active pillar 13 to form an upper source/drain region 55. In an implementation, the upper source/drain region 55 may be formed by performing a third ion implanting process 55i using the interlayer insulating layer 51 as an ion implantation mask.

The upper source/drain region may be spaced apart vertically, i.e., vertically separated, from the lower source/drain region 27. As a result, the active pillar 13 may remain between the upper source/drain region 55 and the lower source/drain region 27. In addition, the active pillar 13 may be surrounded by the gate electrode 49. The gate dielectric layer 47 may remain between the gate electrode 49 and the active pillar 13.

When the first conductivity type is the P type, the second conductivity type may be the N type. Also, when the first conductivity type is the N type, the second conductivity type may be the P type. As discussed above, the first example embodiment is described as using N type impurity ions as the second conductivity type.

Figure 12:
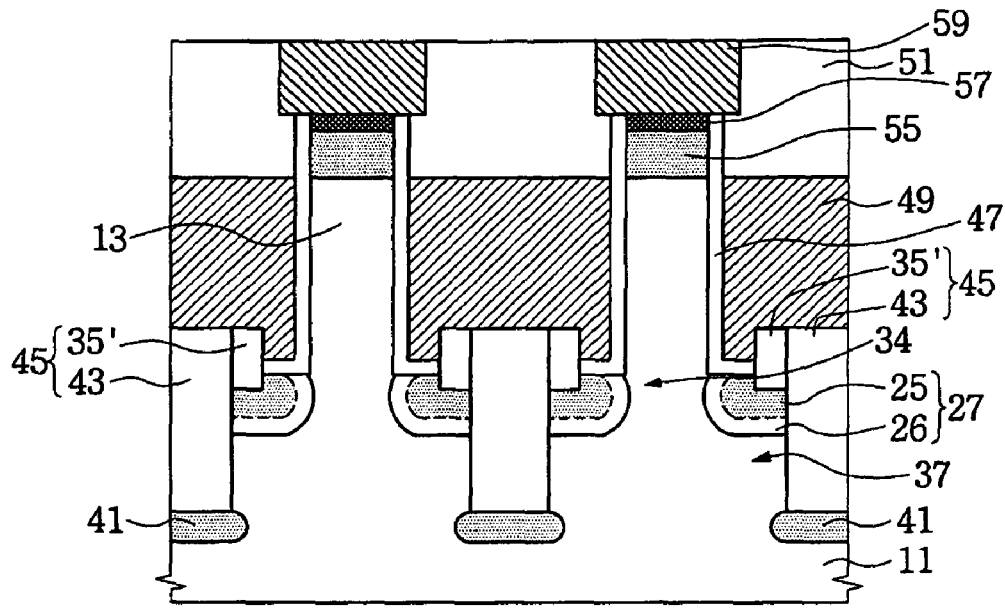

Referring to FIGS. 1 and 12, a metal silicide layer 57 may be formed on a surface of the upper source/drain region 55. A contact plug 59 may be formed on the metal silicide layer 57. The contact plug 59 may be formed of, e.g., a metal layer, a metal silicide layer, a metal nitride layer, a polysilicon layer, or a combination thereof. The contact plug 59 may be formed of a semiconductor layer using, e.g., a selective epitaxial growing (SEG) technique. Upper surfaces of the contact plug 59 and the interlayer insulating layer 51 may be exposed on substantially the same plane.

Figure 13:
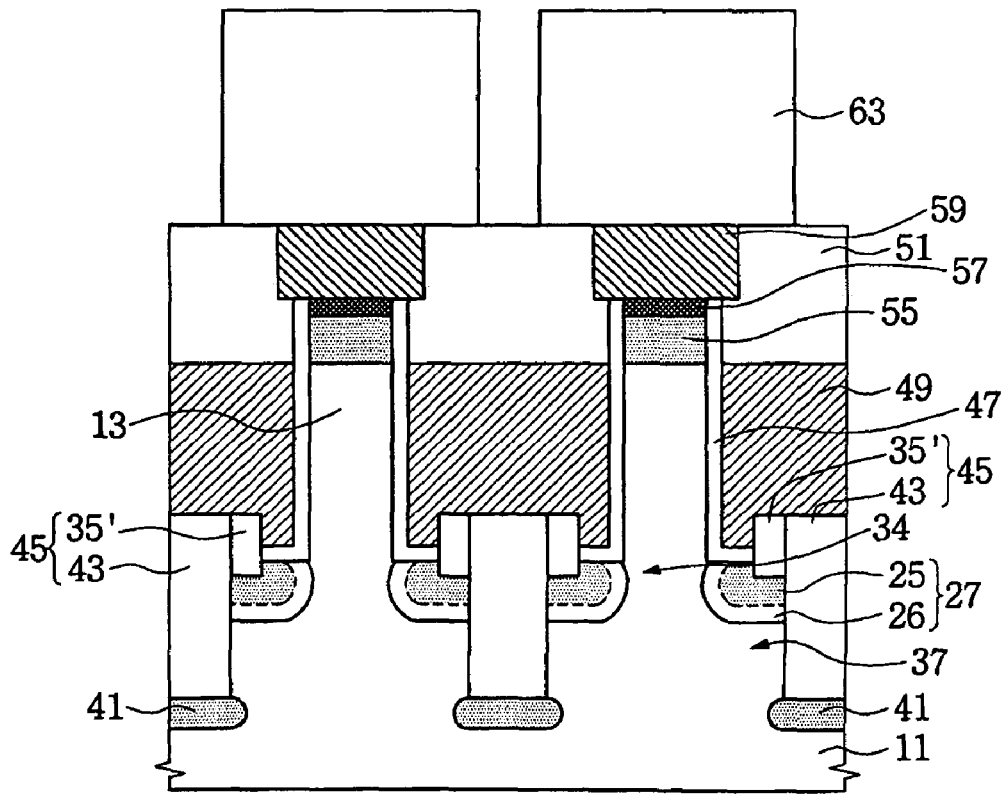

Referring to FIGS. 1 and 13, a storage node 63 that is in contact with the contact plug 59 may be formed on the interlayer insulating layer 51. The storage node 63 may be formed of, e.g., a metal layer, a metal silicide layer, a metal nitride layer, a polysilicon layer, or a combination thereof. The storage node 63 may serve as a lower electrode of a capacitor. The storage node 63 may be electrically connected to the upper source/drain region 55 via the contact plug 59.

The lower source/drain region 27, the active pillar 13, the gate electrode 49, and the upper source/drain region 55 may constitute a vertical channel transistor. Current flow between the source and drain regions may be substantially normal to the substrate 11, and the lower source/drain region 27 may be spaced apart from the upper source/drain region 55 in the direction normal to the substrate by the vertical channel region of the vertical channel transistor.

Figure 14:
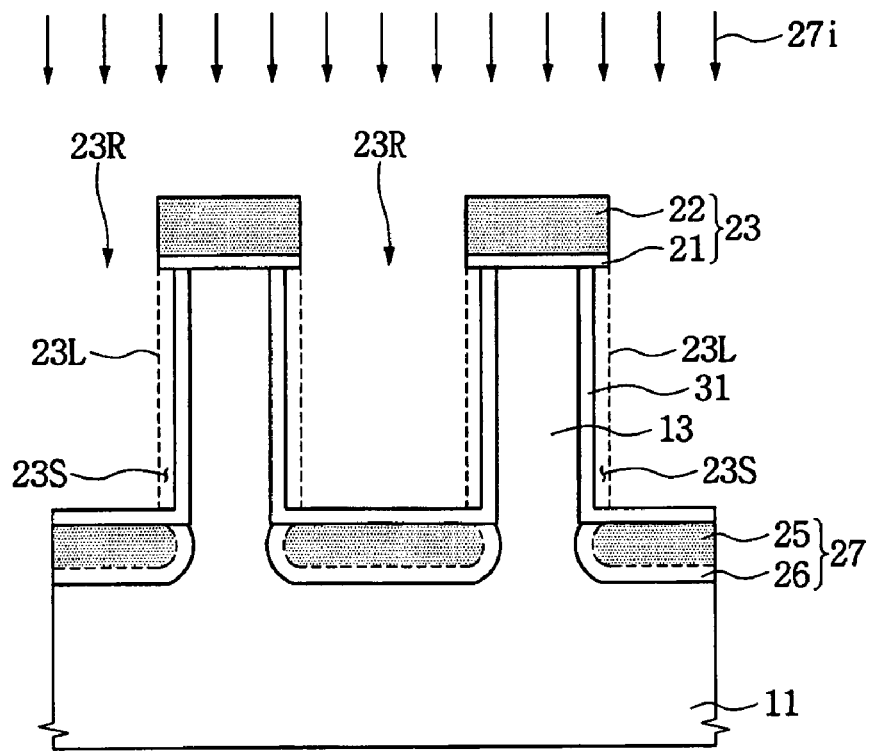
FIG. 14 illustrates a cross-sectional view, taken along line I-I' of FIG. 1, of a stage in a method of fabricating a semiconductor device according to a second example embodiment.

FIG. 14 illustrates a cross-sectional view, taken along line I-I' of FIG. 1, of a stage in a method of fabricating a semiconductor device according to a second example embodiment. A method of fabricating a semiconductor device according to the second example embodiment will now be described with reference to FIGS. 1 and 14.

Referring to FIGS. 1 and 14, the hard mark pattern 23 and the active pillar 13 may be formed on a substrate 11 using the same method as described above with reference to FIGS. 2 to 4. The sidewall oxide layer 31 may be formed on sidewalls of the active pillar 13. The sidewall oxide layer 31 may be formed of, e.g., a thermal oxide layer or a CVD silicon oxide layer.

Impurity ions of a second conductivity type different from the first conductivity type may be implanted into the substrate 11 to form the lower source/drain region 27. The lower source/drain region 27 may include the high-concentration impurity region 25 and the low-concentration impurity region 26. The low-concentration impurity region 26 may be formed to surround the bottom and sidewalls of the high-concentration impurity region 25. When the first conductivity type is the P type, the second conductivity type may be the N type. Also, when the first conductivity type is the N type, the second conductivity may be the P type. For convenience, the second embodiment is described as using N type impurities as the second conductivity type.

The lower source/drain region 27 may be formed by performing a first ion implantation process 27i using the hard mask pattern 23 as an ion implantation mask. The implantation of the second conductivity type impurity ions may be performed in a vertical direction with respect to the surface of the substrate 11. As for the first embodiment, the imaginary normal extension line 23L extends from the outer sidewall of the hard mask pattern 23 to the closest point of the substrate 11. The internal space surrounded by the hard mask pattern 23 and the extension line 23L forms the shadow region 23S. The active pillar 13 and the sidewall oxide layer 31 may be disposed in the shadow region 23S. Sidewalls of the active pillar 13 and the sidewall oxide layer 31 may be separated from the extension line 23L, i.e., the shadow region 23S may surround the active pillar 13 and the sidewall oxide layer 31. A distance between the sidewall of the active pillar 13 and the extension line 23L may be determined depending on the size of the etching region (13E of FIG. 4) and the thickness of the sidewall oxide layer 31.

While the first ion implantation process 27i is performed, the second conductivity type impurity ions may proceed in a straight line unless they collide with obstacles. Since the sidewall oxide layer 31 exists in the shadow region 23S, it may be separated from, i.e., recessed with respect to, the extension line 23L. Thus, a structure may be provided in which there is nothing to prevent the progress of the second conductivity type impurity ions while the first ion implantation process 27i is performed. Accordingly, the second conductivity type impurity ions may be prevented from dispersing and infiltrating the active pillar 13. The second conductivity type impurity ions passing through the vicinity of the hard mask pattern 23 may be implanted into the substrate 11 along an external side of the shadow region 23S. Thus, the lower source/drain region 27 may be self-aligned at the external side of the shadow region 23S.

The lower source/drain region 27 may be formed using, e.g., a DDD technique. The DDD technique may include alternately implanting second conductivity type impurity ions different from each other into the substrate 11 while the first ion implantation process 27i is performed. For example, while the first ion implantation process 27i is performed, As ions and P ions may be alternately implanted into the substrate 11. The As ions may exhibit a different diffusion rate from the P ions. In this case, both the As ions and the P ions may exist in the high-concentration impurity region 25, and only one of the As ions and the P ions may exist in the low-concentration impurity region 26.

In another implementation, the high-concentration impurity region 25 and the low-concentration impurity region 26 may be formed by alternately implanting the same kind of the second conductivity type impurity ions into the substrate 11 using different ion implantation energies while the first ion implantation process 27i is performed.

Figure 15:
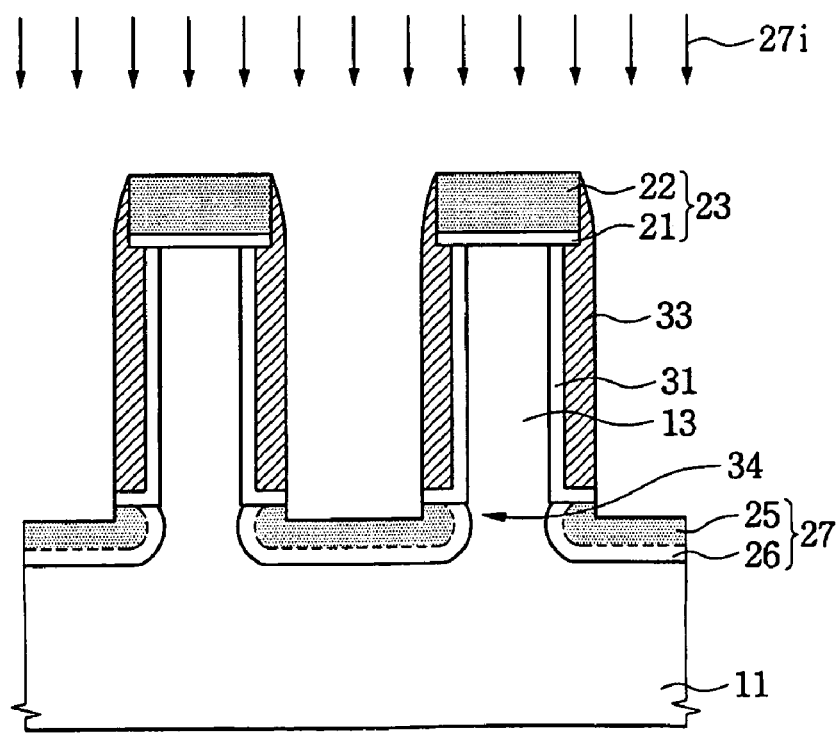
FIG. 15 illustrates a cross-sectional view, taken along line I-I' of FIG. 1, of a stage in a method of fabricating a semiconductor device according to a third example embodiment.

FIG. 15 illustrates a cross-sectional view, taken along line I-I' of FIG. 1, of a stage in a method of fabricating a semiconductor device according to a third example embodiment. A method of fabricating a semiconductor device according to the third example embodiment will now be described with reference to FIGS. 1 and 15.

Referring to FIGS. 1 and 15, the hard mark pattern 23, the active pillar 13, and the sidewall oxide layer 31 may be formed on a substrate 11 using the same method as described above with reference to FIG. 14. The replacement gate 33 may be formed on the sidewall of the active pillar 13 having the sidewall oxide layer 31. The replacement gate 33 may be formed of, e.g., a polysilicon layer, a silicon nitride layer, a silicon oxynitride layer, a silicon oxide layer, or a combination thereof. For example, the replacement gate 33 may be formed of a silicon nitride layer.

Then, the lower source/drain region 27 may be formed by alternately implanting impurity ions of a second conductivity type different from the first conductivity type into the substrate 11. The lower source/drain region 27 may include the high-concentration impurity region 25 and the low-concentration impurity region 26. The low-concentration impurity region 26 may be formed to surround the bottom and sidewalls of the high-concentration impurity region 25. When the first conductivity type is the P type, the second conductivity type may be the N type. Also, when the first conductivity type is the N type, the second conductivity type may be the P type. In the third example embodiment, the second conductivity type may be the N type.

The lower source/drain region 27 may be formed by performing a first ion implantation process 27i using the hard mask pattern 23 and the replacement gate 33 as ion implantation masks. The implantation of the second conductivity type impurity ions may be performed in a vertical direction with respect to the surface of the substrate 11. While the first ion implantation process 27i is performed, the second conductivity type impurity ions may collide with the replacement gate 33 to be partially dispersed. However, a distance from an external wall of the replacement gate 33 to the active pillar 13 is much longer than in the conventional art due to the width of the etching region (13E of FIG. 4). As a result, far fewer second conductivity type impurity ions may infiltrate the active pillar 13.

The lower source/drain region 27 may be formed using a DDD technique. For example, both the As ions and the P ions may exist in the high-concentration impurity region 25, and only one of the As ions and the P ions may exist in the low-concentration impurity region 26. In another implementation, the high-concentration impurity region 25 and the low-concentration impurity region 26 may be formed by alternately implanting the same kind of the second conductivity type impurity ions into the substrate 11 using different ion implantation energies while the first ion implantation process 27i is performed.

As described above, the preliminary active pillar may be formed by etching a substrate using a hard mask pattern as an etch mask. The width of the preliminary active pillar may be reduced to form an active pillar having a narrower width than the hard mask pattern. Thus, the active pillar may be formed in a shadow region of the hard mask pattern. The lower source/drain region may be formed by implanting impurity ions into the substrate adjacent to the active pillar using the hard mask pattern as an ion implantation mask. The impurity ions may be prevented from infiltrating the active pillar during formation of the lower source/drain region.

The lower source/drain region, a gate electrode surrounding the active pillar and an upper source/drain region formed on the active pillar may form a vertical channel transistor. Consequently, a semiconductor device having excellent electrical characteristics may be implemented.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device having a vertical channel transistor, the method comprising:
    forming a hard mask pattern on a substrate;
    forming a preliminary active pillar by etching the substrate using the hard mask pattern as an etch mask;
    reducing a width of the preliminary active pillar to form an active pillar having a width less than that of the hard mask pattern;
    forming a lower source/drain region by implanting impurity ions into the substrate adjacent to an exposed outer periphery on the active pillar and exposed sidewalls of the hard mask pattern using the hard mask pattern as an ion implantation mask, the exposed outer periphery being separated from an imaginary extension line that extends from the exposed sidewalls of the hard mask pattern normal to the substrate, and the exposed outer periphery being separated from the imaginary extension line by a shadow region surrounding the active pillar; and
    forming an upper source/drain region on the active pillar and vertically separated from the lower source/drain region.

2. The method as claimed in claim 1, wherein reducing the width of the preliminary active pillar includes etching the preliminary active pillar using an isotropic etching process having a higher etching rate with respect to the preliminary active pillar than with respect to the hard mask pattern.

3. The method as claimed in claim 1, wherein the lower source/drain region is formed to include a high-concentration impurity region and a low-concentration impurity region, the low-concentration impurity region surrounding sidewalls and a bottom of the high-concentration impurity region.

4. The method as claimed in claim 3, wherein forming the lower source/drain region includes alternately implanting first impurity ions and second impurity ions, the second impurity ions having a conductivity type different from that of the first impurity ions.

5. The method as claimed in claim 4, wherein the first and second impurity ions are selected from arsenic ions and phosphorus ions.

6. The method as claimed in claim 1, further comprising forming a sidewall oxide layer on a sidewall of the active pillar before implanting the impurity ions, the exposed outer periphery on the active pillar including the sidewall oxide layer.

7. The method as claimed in claim 6, further comprising forming a replacement gate on the exposed outer periphery after forming the lower source/drain region, wherein the sidewall oxide layer remains between the active pillar and the replacement gate.

8. The method as claimed in claim 1, further comprising, after forming the lower source/drain region:
    forming a bit mask pattern covering the active pillar;
    etching the substrate using the bit mask pattern as an etch mask to form a bit groove that defines a buried bit line, wherein the bit groove passes through the lower source/drain region; and
    forming an isolation layer filling the bit groove.

9. The method as claimed in claim 8, wherein an upper surface of the isolation layer is formed to be higher than the lower source/drain region.

10. The method as claimed in claim 8, further comprising, before forming the isolation layer:
    forming a leakage prevention region by implanting impurity ions having a different conductivity type from the lower source/drain region into a portion of the substrate that is exposed at a bottom of the bit groove.

11. The method as claimed in claim 8, further comprising, before forming the bit mask pattern:
    forming a replacement gate on the exposed outer periphery of the active pillar after forming the lower source/drain region, wherein the replacement gate is formed of a material layer having an etch selectivity with respect to the bit mask pattern.

12. A method of fabricating a semiconductor device having a vertical channel transistor, the method comprising:
    forming a hard mask pattern on a substrate;
    forming a preliminary active pillar by etching the substrate using the hard mask pattern as an etch mask;
    reducing a width of the preliminary active pillar to form an active pillar having a width less than that of the hard mask pattern;
    forming a lower source/drain region by implanting impurity ions into the substrate adjacent to the active pillar using the hard mask pattern as an ion implantation mask;
    forming an upper source/drain region on the active pillar and vertically separated from the lower source/drain region;
    forming a replacement gate on a sidewall of the active pillar, the replacement gate is formed of a material layer having an etch selectivity with respect to a bit mask pattern;
    after forming the lower source/drain region, forming the bit mask pattern covering the active pillar, etching the substrate using the bit mask pattern as an etch mask to form a bit groove that defines a buried bit line, the bit groove passing through the lower source/drain region, and forming an isolation layer filling the bit groove; and
    after forming the isolation layer, removing the replacement gate, forming a gate electrode surrounding the sidewall of the active pillar and crossing the buried bit line, an upper surface of the gate electrode being below an upper surface of the active pillar, removing the hard mask pattern and exposing the active pillar, and forming the upper source/drain region by implanting impurity ions into the exposed active pillar using impurity ions having the same conductivity type as impurity ions in the lower source/drain region.

13. The method as claimed in claim 12, further comprising forming a storage node on the upper source/drain region, wherein the storage node is electrically connected to the upper source/drain region.

14. A method of fabricating a semiconductor device having a vertical channel transistor, the method comprising:

forming a hard mask pattern on a substrate;

forming a preliminary active pattern by etching the substrate using the hard mask pattern as an etch mask;

reducing a width of the preliminary active pattern to form an active pattern having a width less than that of the hard mask pattern;

implanting impurity ions into the substrate adjacent to an exposed outer periphery on the active pattern and exposed sidewalls of the hard mask pattern using the hard mask pattern as an ion implantation mask, the exposed outer periphery being separated from an imaginary extension line that extends from the exposed sidewalls of the hard mask pattern normal to the substrate, and the exposed outer periphery being separated from the imaginary extension line by a shadow region surrounding the active pattern; and forming an upper source/drain region on the active pattern and vertically separated from the impurity ions that are in the substrate adjacent to the active pattern.

15. The method as claimed in claim 14, wherein reducing the width of the preliminary active pattern includes etching the preliminary active pattern using an isotropic etching process having a higher etching rate with respect to the preliminary active pattern than with respect to the hard mask pattern.

16. The method as claimed in claim 14, wherein implanting the impurity ions into the substrate includes alternately implanting first impurity ions and second impurity ions, the second impurity ions having a conductivity type different from that of the first impurity ions.

17. The method as claimed in claim 16, wherein the first and second impurity ions are selected from arsenic ions and phosphorus ions.

18. The method as claimed in claim 14, further comprising, before implanting the impurity ions, forming a sidewall oxide layer on the sidewall of the active pattern, the exposed outer periphery of the active pattern including the sidewall oxide layer.

19. The method as claimed in claim 14, further comprising forming a replacement gate on the exposed outer periphery after forming the lower source/drain region, wherein the sidewall oxide layer remains between the active pillar and the replacement gate.

* * * * *